METHOD OF FORMING LEADS ON SEMICONDUCTOR DEVICES

Filed Aug. 4, 1967 4 Sheets-Sheet 1

INVENTORS.
NINO P. CERNIGLIA and
RICHARD C. TONNER

BY David M. Keay

AGENT.

METHOD OF FORMING LEADS ON SEMICONDUCTOR DEVICES

Filed Aug. 4, 1967 4 Sheets-Sheet 2

INVENTORS.
NINO P. CERNIGLIA and
RICHARD C. TONNER

BY David M. Keay

AGENT.

METHOD OF FORMING LEADS ON SEMICONDUCTOR DEVICES

INVENTORS.
NINO P. CERNIGLIA and
RICHARD C. TONNER

BY David M. Keay

AGENT.

METHOD OF FORMING LEADS ON SEMICONDUCTOR DEVICES

Filed Aug. 4, 1967 4 Sheets-Sheet 4

INVENTORS.
NINO P. CERNIGLIA
and RICHARD C. TONNER

BY David M. Keay

AGENT.

United States Patent Office 3,556,951

Patented Jan. 19, 1971

3,556,951

METHOD OF FORMING LEADS ON SEMICONDUCTOR DEVICES

Nino P. Cerniglia, Revere, and Richard C. Tonner, Braintree, Mass., assignors to Sylvania Electric Products Inc., a corporation of Delaware Filed Aug. 4, 1967, Ser. No. 658,427
Int. Cl. C23f *1/02, 17/00;* C23b *5/64*
U.S. Cl. 204—15 4 Claims

ABSTRACT OF THE DISCLOSURE

Method of forming supporting beam leads on a semiconductor wafer by depositing in succession thin layers of titanium, molybdenum, and gold, masking with non-conductive photo-resist, and electroplating gold to form thick members. The titanium, molybdenum, and gold not covered by the gold members are removed in a series of compatible steps leaving beam leads of titanium, molybdenum, and gold.

BACKGROUND OF THE INVENTION

This invention relates to semiconductor electrical translating devices. More particularly, it is concerned with methods of forming conductive leads affixed to bodies of semiconductor material.

Recently methods have been developed for forming relatively heavy supporting leads, or beam leads, which adhere to a body of semiconductor material containing the electrically active regions of a semiconductor device and are suitable for providing electrical connections from the active regions to external leads or for providing interconnections between components of an integrated circuit network. The leads are fabricated on the surface of a wafer of semiconductor material and portions of the wafer are removed to leave a body of semiconductor material containing the electrically active elements of the device with portions of the leads adhering to the surface of the body and other portions extending outward from the body. The outwardly extending portions may be directly connected, as by welding, to the leads of a suitable enclosure or contact areas of a circuit board.

The supporting leads are formed on a wafer of semiconductor material (typically silicon) after the active regions have been produced by diffusion and the surface of the wafer has been covered with an adherent non-conductive protective coating (typically silicon oxide) having openings exposing areas of the active regions at which electrical contact is to be made by the leads. The leads are fabricated in a series of steps employing various materials in succession in order to delineate the pattern of the leads, provide for adherence of the leads to the wafer, and build up lead members having satisfactory mechanical strength and a suitable surface for making electrical contact. An electroplating technique is employed to build up the lead members. During the electroplating process the surface of the wafer is covered by conductive material which in turn is covered with a non-conductive masking coating except for those areas on which the lead members are formed. Subsequent to the plating step the conductive material between the lead members is removed.

Because the materials and procedures employed at each step in the process must be compatible with those employed in preceding steps, there are many problems in fabricating beam leads having the desired electrical and mechanical characteristics. Certain of the methods which have been developed employ processing steps or materials which are difficult to control. Other methods involve a complex series of processing steps.

SUMMARY OF THE INVENTION

The present invention, therefore, is concerned with an improved method of forming connecting leads to a body of semiconductor material. A surface of the body of semiconductor material is coated with an adherent layer of a nonconductive material interspersed with conductive contacts in ohmic connection with underlying portions of the body. A thin layer of titanium is deposited over the entire surface of the layer of non-conductive material and the conductive contacts. A thin layer of molybdenum is deposited over the entire surface of the layer of titanium. Then a thin layer of gold is deposited over the entire surface of the layer of molybdenum. Next, non-conductive masking material is placed on predetermined portions of the layer of gold as by employing known photo-resist masking procedures. Portions of the layer of gold which overlie the portions of the layer of non-conductive material and the conductive contacts on which the leads are to be fabricated remain exposed thereby delineating the areas upon which the connecting leads are to be formed. Gold is electroplated onto the assembly and deposits on the exposed portions of the layer of gold to form relatively thick conductive members.

Then the non-conductive masking material is removed, and the assembly is subjected to an etching solution which is capable of dissolving gold. The assembly is treated by the etching material for sufficient time to remove the portions of the layer of gold formerly covered by the masking material and expose the underlying portions of the layer of molybdenum. The electroplated gold members are also attacked by the etching solution, but because of their relative thickness they are not damaged significantly. The assembly is subjected to an etching material capable of dissolving molybdenum but not the other materials of the assembly to remove the exposed portions of the layer of molybdenum and expose the underlying portions of the layer of titanium. Then the assembly is subjected to another etching material which is capable of dissolving titanium but not the other materials of the assembly in order to remove the exposed portions of the layer of titanium. Thus connecting leads constituted of successive layers of titanium, molybdenum, gold, and the electroplated gold members remain overlying portions of the layer of non-conductive material and the conductive contacts in the pattern delineated by the openings in the masking material.

Subsequent to formation of the connecting leads the assembly may be divided into individual devices as by appropriately masking the body of semiconductor material and subjecting it to an etching solution which dissolves the semiconductor material surrounding the electrically active regions of each device. Individual devices having supporting leads in ohmic contact with the diffused active regions of the devices and with portions of the leads extending outward beyond the individual device bodies are thereby produced.

BRIEF DESCRIPTION OF THE DRAWINGS

Various objects, features, and advantages of the method of the invention will be apparent from the following detailed discussion and the accompanying drawings wherein.

Figure 1:
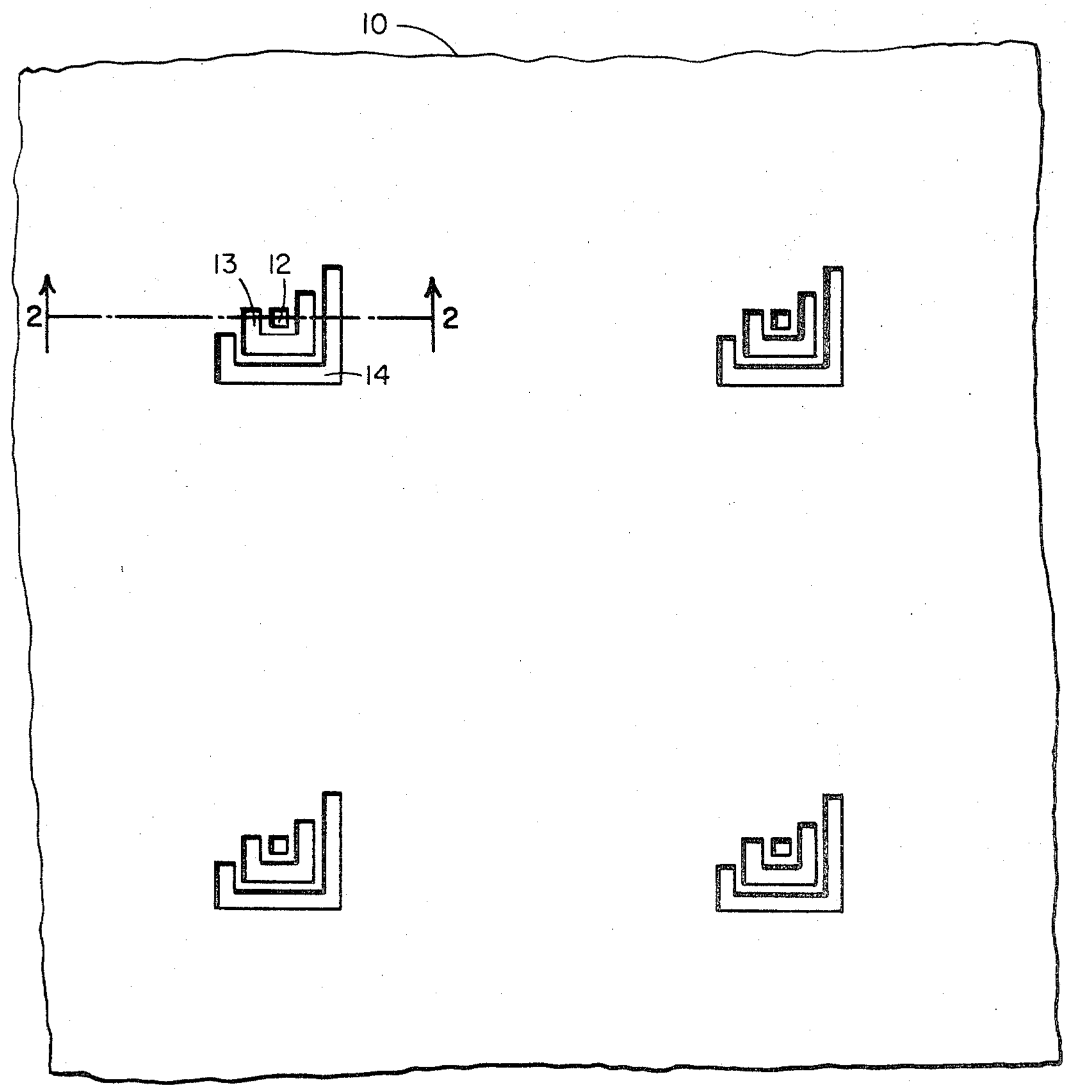
FIG. 1 is a plan view of a fragment of a wafer of silicon within which the electrically active elements of a plurality of transistors have been formed by diffusion showing the coating of non-conductive silicon oxide and the openings in the coating to which contacts are to be made by supporting leads.

Because of the extremely small size of various portions of the elements illustrated in the drawings, some of the dimensions of many of the elements have been exaggerated with respect to other dimensions. It is believed that greater clarity of presentation is thereby obtained despite consequent distortion of elements in relation to their actual physical appearance.

DETAILED DESCRIPTION OF THE INVENTION

Figure 2:
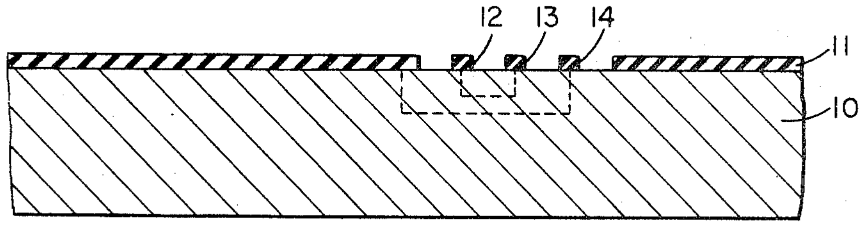
FIG. 2 is an enlarged view of a portion of the fragment of FIG. 1 taken in cross-section along the line 2—2 of FIG. 1.

In the fabrication of semiconductor devices of the diffused type either as individual components or as groups of components in the form of integrated circuit networks hundreds of devices are produced at one time in a wafer of semiconductor material of relatively large surface area. A fragment of such a wafer 10 of silicon having a plurality of identical transistors formed by diffusion of conductivity type imparting materials into the wafer is illustrated in FIG. 1. FIG. 2 is an enlarged cross-sectional elevational view of a portion of the fragment. The upper flat major surface of the wafer is covered by silicon oxide 11 which forms an adherent, non-conductive, protective coating over the surface. Openings 12, 13 and 14 in the oxide expose areas of the surface at the emitter, base, and collector regions, respectively, to which electrical connections for each device are to be made. The wafer as illustrated is produced by the well-known processes of diffusing conductivity type imparting materials through openings in oxide coatings which are defined by photo-resist masking and etching techniques.

Figure 3:
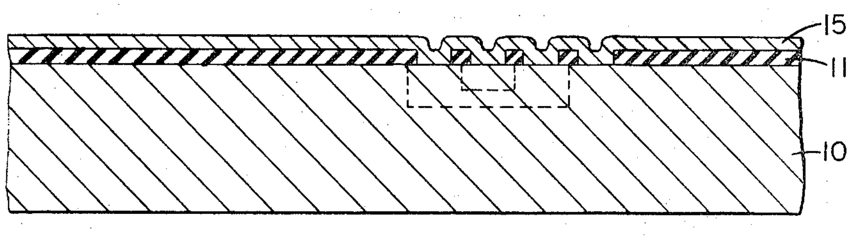
FIGS. 3 and 4 are elevational views of the wafer as shown in FIG. 2 illustrating stages in the process of forming ohmic contacts to the silicon at the openings in the oxide coating.

A conductive contact is formed in each of the openings in the oxide coating to make ohmic connection to the exposed silicon. The ohmic contacts may be formed by placing the silicon wafer in a suitable apparatus and sputtering platinum onto the upper surface. As shown in FIG. 3 a layer of platinum 15 approximately 700 angstrom units thick is deposited on the surface of the oxide coating 11 and on the exposed areas of the silicon. The temperature of the silicon wafer is raised to approximately 600° C. without removing it from the sputtering apparatus causing the platinum within the openings to combine with the silicon and form platinum silicide. The platinum in contact with the oxide is not affected.

Figure 4:
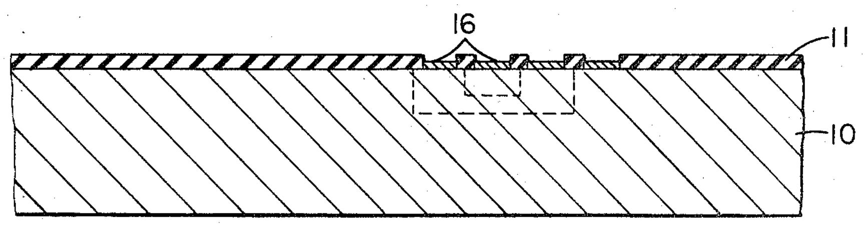

The wafer is immersed in a standard aqua regia solution of 1 part nitric acid and 3 parts hydrochloric acid for a period of about 3 minutes. The aqua regia solution dissolves the platinum, but does not attack the silicon, silicon oxide, or the platinum silicide. The platinum silicide adheres to the silicon and forms an ohmic conductive contact 16 as shown in FIG. 4.

Figure 5:
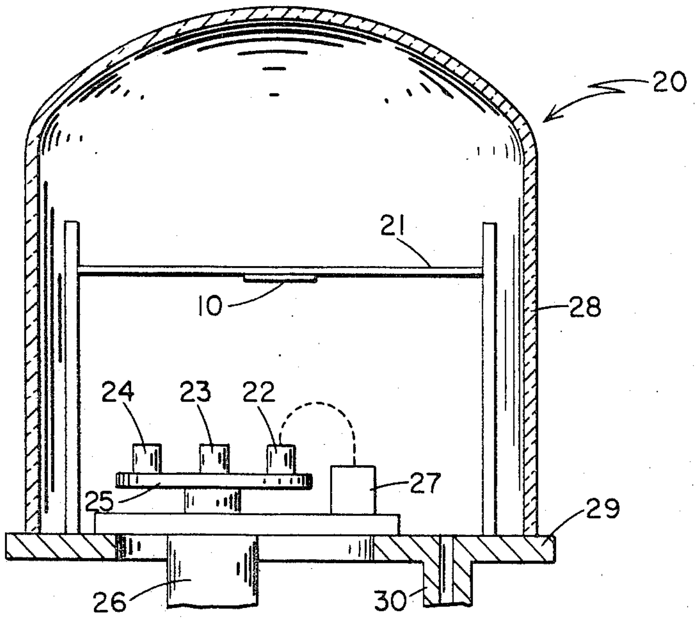
FIG. 5 is a schematic representation of electron beam evaporation apparatus which may be employed in depositing the layers of titanium, molybdenum, and gold onto the wafer of silicon.

Next, the wafer is placed in a suitable vacuum deposition apparatus. The apparatus 20 illustrated schematically in FIG. 5 is of the electron beam evaporation type, although other types of coating equipment, for example cathode sputtering apparatus, may be employed. The wafer 10 is mounted on a holder 21 with the oxide coated surface downward. Charges of the materials to be evaporated are placed in crucibles 22, 23 and 24. The crucibles are mounted on a rotatable support 25 which is rotated by a suitable mechanism 26 controlled from the exterior of the vacuum chamber. An electron gun 27 is arranged with suitable focusing apparatus (not shown) to direct an electron beam into the crucible positioned directly beneath the wafer.

Figure 6:
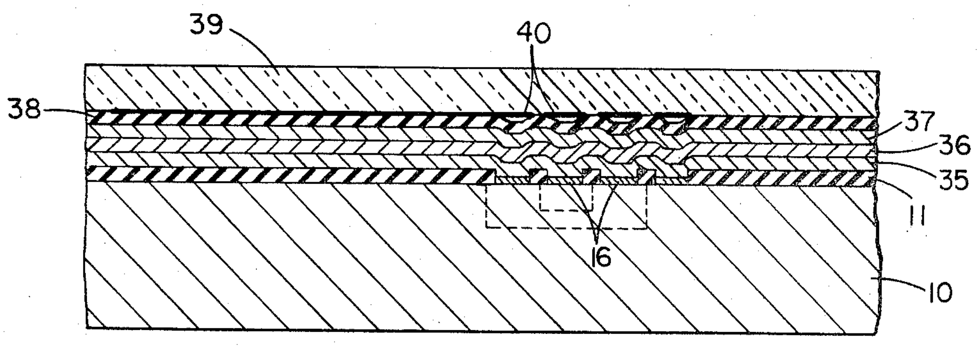
FIG. 6 is an elevational view of the wafer subsequent to the deposition of the layers of titanium, molybdenum, and gold with a layer of photosensitive resist and a mask-delineating the pattern of the leads to be formed in position on the assembly.

In carrying out the process according to the invention the wafer 10 is mounted on the holder 21 and charges of pure titanium, molybdenum, and gold are placed in the crucibles 22, 23 and 24, respectively. The bell jar 28 is sealed to the base plate 29, and the chamber is evacuated through the port 30. When the pressure in the chamber is about $1\times10^{-6}$ torr the electron beam gun is activated, directing a stream of electrons onto the charge of titanium in the crucible 22. Titanium evaporates from the crucible and deposits over the entire lower surface of the wafer 10. Titanium is evaporated until a layer 35 approximately 1,500 angstrom units thick is deposited over the entire surface of the wafer as shown in FIG. 6. Then the support 25 is indexed to position the crucible 23 containing the charge of molybdenum in position to be evaporated by the electron beam. Molybdenum is deposited on the surface of the layer of titanium to produce a layer 36 about 2,500 angstrom units thick. The support 25 is indexed again to position the third crucible 24 containing the charge of gold into position to be evaporated by the electron beam. A gold layer 37 approximately 1,000 angstrom units thick is deposited over the layer of molybdenum. The three layers are deposited in sequence without disturbing the vacuum in the chamber, thereby maintaining a high degree of cleanliness at the interfaces between the layers of metal.

After the layers of titanium 35, molybdenum 36, and gold 37 have been deposited on the wafer as shown in FIG. 6, the wafer is removed from the vacuum deposition apparatus 20 and a layer 38 of a photosensitive resistant material is placed over the surface of the gold layer 37. Any of the well-known photosensitive polymerizable resistant materials of the type employed in known photo-resist masking and etching techniques for forming openings in silicon oxide may be used. The resistant material is applied as by spinning on or by spraying.

The layer of photosensitive material is dried, and then selectively exposed to ultraviolet light through a mask 39. The mask is of a transparent material, typically glass, and portions 40 of one surface are rendered opaque in a particular predetermined pattern conforming to the pattern of the leads to be produced. The mask is fabricated by employing known photolithographic techniques which enable the opaque areas and the spaces between them to be defined with a high degree of precision.

Figure 7:
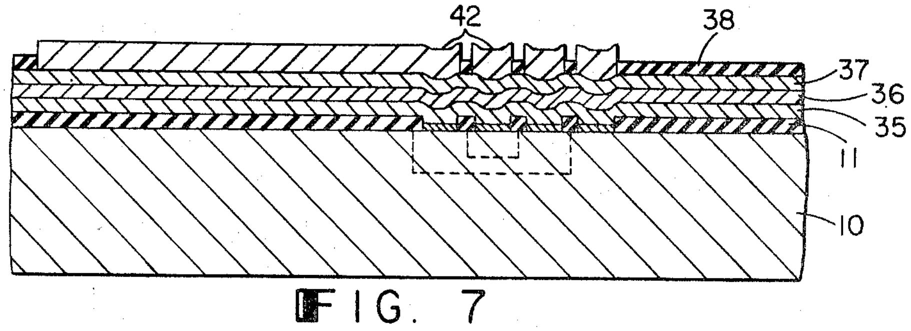
FIG. 7 is a view of the wafer showing the gold lead members electroplated onto the portions of the gold layer exposed at the openings in the masking material.

The mask is properly aligned with the silicon wafer by observation of the pattern of depressions in the surface of the photosensitive resistant material caused by the underlying openings in the silicon oxide. The mask and wafer are subjected to ultraviolet light which polymerizes the portions of the photosensitive material underlying the transparent regions of the mask. Then the mask is removed, and the wafer is rinsed in a suitable developing solution which washes away the portions of the resistant material which were under the opaque regions of the mask and thus not exposed to the ultraviolet light. The assembly may then be baked to further polymerize and harden the resistant material. The remaining resistant material 38 as shown in FIG. 7 provides a non-conductive mask adhering to the surface of the gold layer 37.

The underside of the wafer is masked with a non-conductive material and the assembly is immersed in a gold plating solution, for example, a standard gold cyanide plating bath. A cathode connection is made through the resistant masking material to the underlying gold layer 37 near the edge of the wafer. Since the titanium, molybdenum, and gold layers are continuous over the entire wafer, a single connection is all that is required. The non-conductive resistant masking material 38 remains in place over the remainder of the gold layer and is not disturbed by the plating solution. Gold deposits only on the exposed conductive surface of the gold layer. Electroplating is carried out under appropriate conditions of current density and for a suitable time in accordance with the area of the exposed surface so as to produce gold members 42 approximately .1 mil thick overlying the unmasked portions of the gold layer as shown in FIG. 7.

Figure 8:
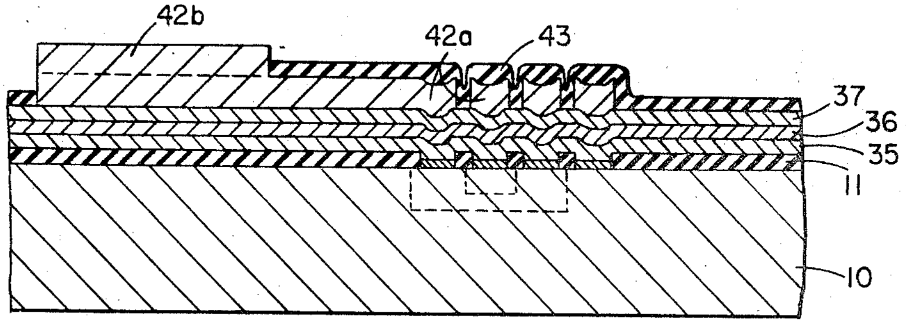
FIG. 8 shows the wafer after a subsequent application of masking material and an additional electroplating step to increase the thickness of portions of the gold lead members.

The masking material 38 is removed by dissolving in a suitable solution, and by employing the procedure described previously and an appropriate transparent mask a non-conductive masking material 43 is placed on the exposed portions of the gold layer 37 and portions **42*a* of the electroplated gold members as shown in FIG. 8. Then the assembly is replaced in the plating bath and the electroplating procedure continued until the exposed portions 42*b*** of the gold members are approximately .3 mil thick. Whether the electroplating process is performed in two stages to produce members having portions of different thickness as described herein or in a single stage to produce members of uniform thickness is a matter of choice depending primarily upon the spacing of adjacent members.

Following electroplating of the gold members and suitable rinsing of the assembly, the masking material is removed by dissolving in a suitable solvent. Then the portions of the titanium 35, molybdenum 36, and gold 37 layers which do not underlie the electroplated gold members 42 are removed in a series of etching steps. The assembly is first placed in a gold etching solution which consists of 4 parts by weight of potassium iodide, 1 part by weight of iodine, and 4 parts by weight of water. This etching material etches gold at the rate of about 500 angstrom units per second and, therefore, the assembly is immersed in the solution for a period of about 2½ seconds in order to remove the exposed portions of the gold layer 37. Approximately 1,000 angstrom units of gold is also removed from the gold members 42. However, because of the thickness of the members they are not significantly affected by the etching step. The removal of the exposed portions of the gold layer exposes the underlying portions of the molybdenum layer 36.

The assembly is immersed in a molybdenum etching solution consisting of 1 part by volume of reagent grade nitric acid, 2 parts by volume of reagent grade phosphoric acid, and 2 parts by volume of glacial acetic acid. This solution etches molybdenum at a rate of about 2,500 angstrom units per minute. The solution does not attack gold or titanium and, therefore, only molybdenum is dissolved, the gold members serving as a mask. The assembly is immersed in the etching solution for a period of about 1 minute which is sufficient time to remove the exposed portions of the molybdenum layer 36 but not sufficient to undercut the molybdenum under the gold members 42.

The assembly is then immersed in an etching solution of hot (about 60° C.) concentrated sulfuric acid to remove the exposed portions of the titanium layer. Treatment for about 1 minute in the solution is sufficient to remove the exposed portions of the titanium layer 35. The resulting wafer is shown in FIG. 9.

Figure 9:
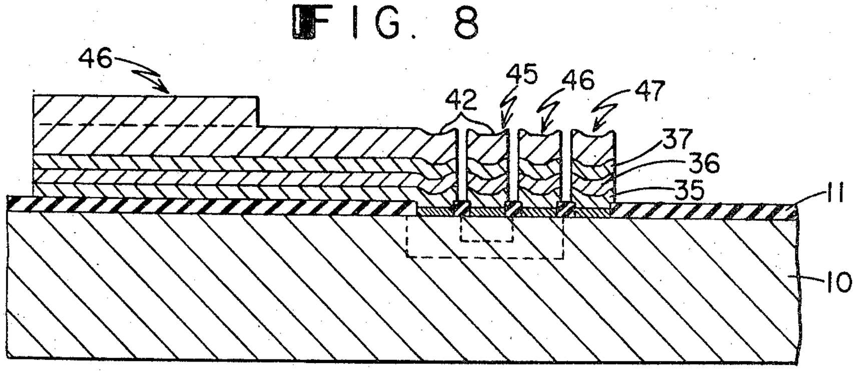
FIG. 9 is a view of the wafer after removal of the masking material and the portions of the deposited layers of titanium, molybdenum, and gold which are not covered by the electroplated gold members.
Figure 10:
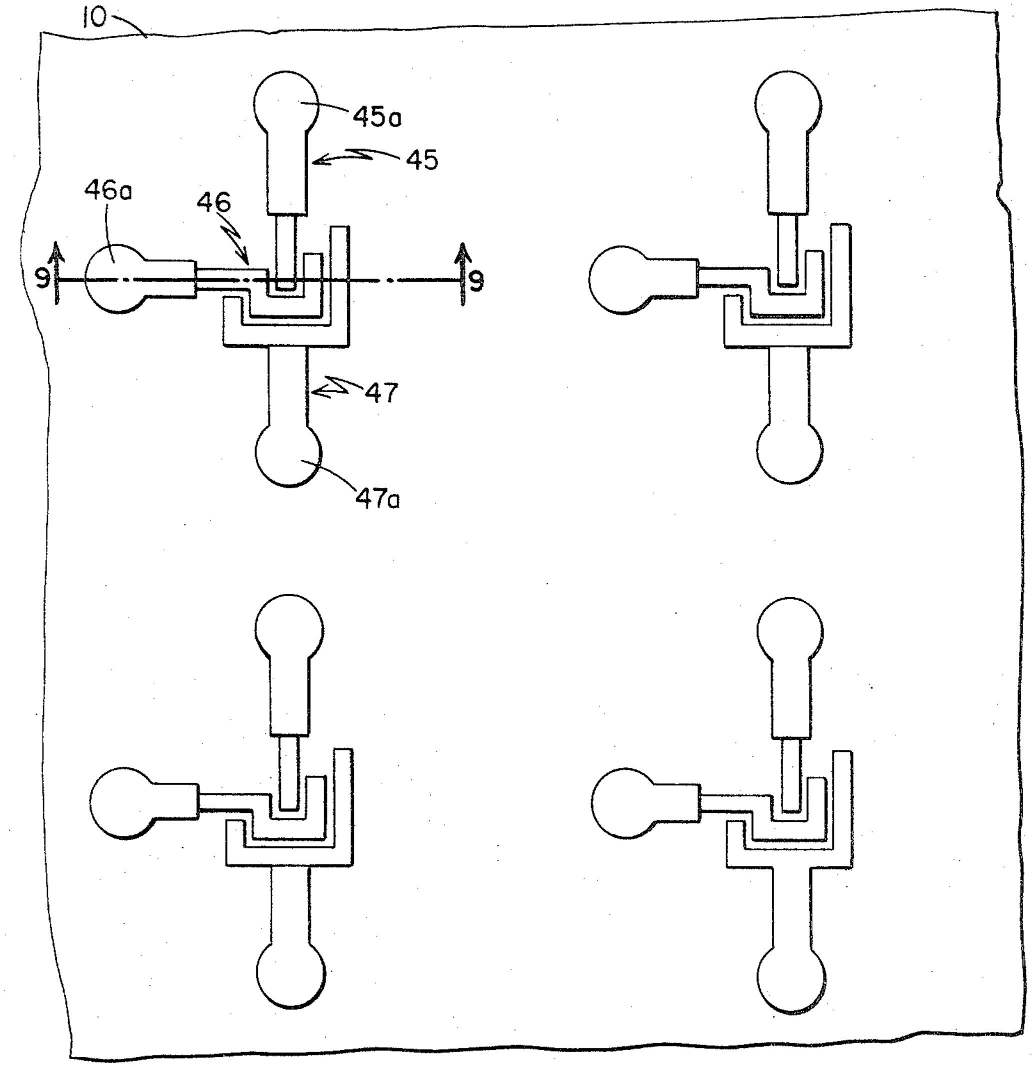
FIG. 10 is a plan view of the fragment of the wafer shown in FIG. 1 at the stage of processing illustrated in the cross-sectional view of FIG. 9 which is taken along line 9—9 of FIG. 10.

FIG. 10 is a plan view of a fragment of the wafer at the stage shown in FIG. 9. The line 9—9 in FIG. 10 indicates the plane of the cross-section of the elevational view of FIG. 9. The remaining portions of the titanium, molybdenum, and gold layers and the electroplated gold members provide separate supporting leads 45, 46, and 47 to the emitter, base, and collector regions, respectively, of each transistor. As shown the portions **45*a*, 46*a* and 47*a*** of the leads have been electroplated to a greater thickness than the remaining portions.

After completion of the steps of forming the supporting leads according to the method of the invention, the wafer is processed in accordance with known techniques to divide the wafer into individual transistors. The entire upper surface of the wafer is masked with a suitable resistant material and the wafer is subjected to an etching solution which dissolves silicon from the undersurface of the wafer to reduce the silicon wafer to a thickness of about 2 mils. The undersurface of the wafer is then suitably masked to protect the active regions of each transistor, and the assembly is again subjected to an etching solution to remove the unprotected silicon.

Figure 11:
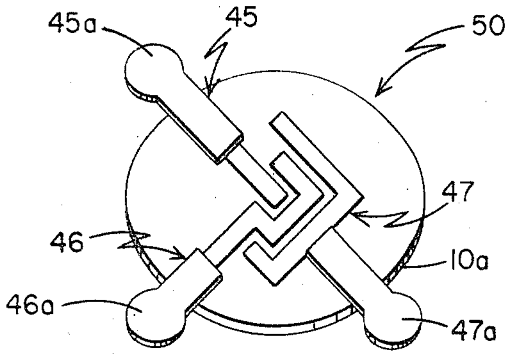
FIG. 11 is a perspective view illustrating an individual beam lead transistor after the wafer as shown in FIG. 10 has been divided into separate devices.

The wafer is thus divided into plurality of identical transistors 50 as shown in FIG. 11, each transistor having emitter, base, and collector regions with supporting or beam leads 45, 46 and 47, respectively, making contact thereto. Portions **45*a*, 46*a* and 47*a* of the leads extend outward from the silicon body 10*a*** of the transistor to serve as external contacts to the active regions of the transistor. These beam leads may be connected directly, as by welding, to the leads or other conductive members of an enclosure or circuit board on which the device is mounted.

The method of the invention as described involves an uncomplicated series of controllable steps employing compatible metals and etching materials to produce supporting leads. The nature of the titanium-molybdenum-gold combination as employed provides supporting leads having excellent electrical and mechanical characteristics. Titanium is an active metal which when deposited reacts with the silicon oxide to provide very good adhesion to the oxide coating. The titanium also forms a good electrical connection to the platinum silicide contacts. The molybdenum layer serves as a barrier between the titanium and the gold which otherwise would tend to diffuse into the titanium and react with the silicon oxide. The molybdenum adheres both to the titanium and to the evaporated gold layer in a satisfactory manner despite the tendency of molybdenum to form an oxide film because the three layers are deposited in succession within a vacuum and the titanium-molybdenum-gold interfaces are not exposed to contamination. The surfaces of the gold members do not become contaminated by the atmosphere and connections can easily be made to the gold members as by welding or other known bonding techniques. The intermediate layer of gold establishes an uncontaminated base on which the gold members may be electroplated.

While there has been shown and described what is considered a preferred embodiment of the present invention, it will be obvious to those skilled in the art that various changes and modifications may be made therein without departing from the invention as defined in the appended claims.

What is claimed is:

1. The method of forming connecting leads to a body of semiconductor material having a surface coated with an adherent layer of a non-conductive material interspersed with conductive contacts in ohmic connection with underlying portions of said body including the steps of depositing a layer of titanium over the entire surface of the layer of non-conductive material and the conductive contacts, depositing a layer of molybdenum over the entire surface of the layer of titanium, depositing a layer of gold over the entire surface of the layer of molybdenum, placing non-conductive masking material on predetermined portions of the layer of gold overlying portions of the layer of non-conductive material and leaving exposed other portions of the layer of gold overlying other portions of the layer of non-conductive material and at least portions of the conductive contacts, the exposed portions delineating areas on which connecting leads are to be formed, electroplating gold onto the assembly whereby gold deposits on said exposed other portions of the layer of gold to form conductive members overlying said other portions of the layer of non-conductive material and the conductive contacts, removing the non-conductive masking material, subjecting the assembly to etching material capable of dissolving gold for a period of time sufficient to remove said predetermined portions of the layer of gold and expose the underlying portions of the layer of molybdenum, subjecting the assembly to etching material capable of dissolving molybdenum but not the other materials of the assembly to remove the exposed portions of the layer of molybdenum and expose the underlying portions of the layer of titanium, and subjecting the assembly to an etching material capable of dissolving titanium but not the other materials of the assembly to remove the exposed portions of the layer of titanium whereby connecting leads remain overlying said other portions of the layer of non-conductive material and the conductive contacts.

2. The method of forming connecting leads to a body of semiconductor material in accordance with claim 1 wherein the steps of depositing a layer of titanium, depositing a layer of molybdenum, and depositing a layer of gold are performed in sequence in vacuum deposition apparatus with said body of semiconductor material remaining in the apparatus under conditions of vacuum until the three deposition steps are completed.

3. The method of producing semiconductor devices having connecting leads attached thereto including the steps of providing a body of semiconductor material having a surface coated with an adherent non-conductive coating having openings therein exposing surface areas of said body, establishing conductive contacts at the exposed surface areas in ohmic contact with the semiconductor material at the exposed surface areas, depositing a layer of titanium approximately 1,500 angstrom units thick over the entire surface of the layer of non-conductive material and the conductive contacts, depositing a layer of molybdenum approximately 2,500 angstrom units thick over the entire surface of the layer of titanium, depositing a layer of gold approximately 1,000 angstrom units thick over the entire surface of the layer of molybdenum, said steps of depositing a layer of titanium, depositing a layer of molybdenum, and depositing a layer of gold being performed in sequence in vacuum deposition apparatus with said body of semiconductor material remaining in the apparatus under conditions of vacuum until the three deposition steps are completed, placing non-conductive masking material on predetermined portions of the layer of gold overlying portions of the layer of non-conductive material and leaving exposed other portions of the layer of gold overlying other portions of the layer of non-conductive material and at least portions of the conductive contacts, the exposed portions delineating areas on which connecting leads are to be formed, electroplating the assembly in a gold plating solution whereby gold deposits on said exposed other portions of the layer of gold to form conductive members greater than approximately .1 mil thick overlying said other portions of the layer of non-conductive material and the conductive contacts, removing the non-conductive masking material, subjecting the assembly to etching material capable of dissolving gold to remove approximately 1,000 angstrom units of gold from the assembly and expose the portions of the layer of molybdenum underlying said predetermined portions of the layer of gold, subjecting the assembly to an etching material capable of dissolving molybdenum but not the other materials of the assembly to remove the exposed portions of the layer of molybdenum and expose the underlying portions of the layer of titanium, and subjecting the assembly to an etching material capable of disolving titanium but not the other materials of the assembly to remove the exposed portions of the layer of titanium whereby connecting leads remain overlying said other portions of the layer of non-conductive material and the conductive contacts.

4. The method of producing semiconductor devices having connecting leads attached thereto in accordance with claim 3 wherein said semiconductor material is silicon, said adherent non-conductive coating is of silicon oxide, said etching material capable of dissolving gold is an aqueous solution of potassium iodide and iodine, said etching material capable of dissolving molybdenum is an aqueous solution of phosphoric acid, nitric acid, and acetic acid, and said etching material capable of dissolving titanium is concentrated sulfuric acid.

References Cited

UNITED STATES PATENTS 3,256,588 6/1966 Siking et al. ---------- 156—3X

JACOB H. STEINBERG, Primary Examiner

U.S. Cl. X.R.

156—3, 11, 17; 204—32, 38